(12) United States Patent
Yang et al.

(10) Patent No.: US 11,776,657 B2
(45) Date of Patent: Oct. 3, 2023

(54) PAGE BUFFER, MEMORY DEVICE INCLUDING THE PAGE BUFFER AND OPERATING METHOD THEREOF

(71) Applicant: SK hynix Inc., Icheon-si (KR)

(72) Inventors: In Gon Yang, Icheon-si (KR); Tae Ho Kim, Icheon-si (KR); Jae Hyeon Shin, Icheon-si (KR); Sungmook Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/238,957

(22) Filed: Apr. 23, 2021

(65) Prior Publication Data

US 2022/0122687 A1    Apr. 21, 2022

(30) Foreign Application Priority Data

Oct. 16, 2020    (KR) ................. 10-2020-0134650

(51) Int. Cl.
*G11C 29/50* (2006.01)
*G11C 16/30* (2006.01)
*G11C 16/04* (2006.01)

(52) U.S. Cl.
CPC .... *G11C 29/50004* (2013.01); *G11C 16/0483* (2013.01); *G11C 16/30* (2013.01); *G11C 2029/5004* (2013.01)

(58) Field of Classification Search
CPC .......... G11C 29/50004; G11C 16/0483; G11C 16/30; G11C 2029/5004
See application file for complete search history.

(56) References Cited

U.S. PATENT DOCUMENTS

| | | | | |
|---|---|---|---|---|
| 8,004,914 B2* | 8/2011 | Cha | ..................... | G11C 29/38 |
| | | | | 365/201 |
| 10,847,229 B2* | 11/2020 | Jo | ..................... | G11C 16/3459 |
| 11,152,038 B2* | 10/2021 | Kota | ..................... | G11C 7/065 |
| 2012/0008416 A1* | 1/2012 | Cho | ..................... | G11C 29/50 |
| | | | | 365/185.25 |
| 2016/0064093 A1* | 3/2016 | Maeda | ..................... | G11C 16/24 |
| | | | | 365/185.05 |

FOREIGN PATENT DOCUMENTS

KR    1020090107769 A    10/2009
KR    1020100013954 A    2/2010

* cited by examiner

*Primary Examiner* — Vanthu T Nguyen
(74) *Attorney, Agent, or Firm* — WILLIAM PARK & ASSOCIATES LTD.

(57) ABSTRACT

A memory device includes a page buffer, a voltage generator, and a test controller. The page buffer is connected to a memory cell through a bit line, and is configured to sense a threshold voltage of the memory cell through a potential of a sensing node electrically connected to the bit line. The voltage generator is configured to generate a test voltage to be applied to the sensing node. The test controller is configured to control the voltage generator to apply the test voltage to the sensing node, and detect a defect of the page buffer, based on a leakage current value of the sensing node.

15 Claims, 9 Drawing Sheets

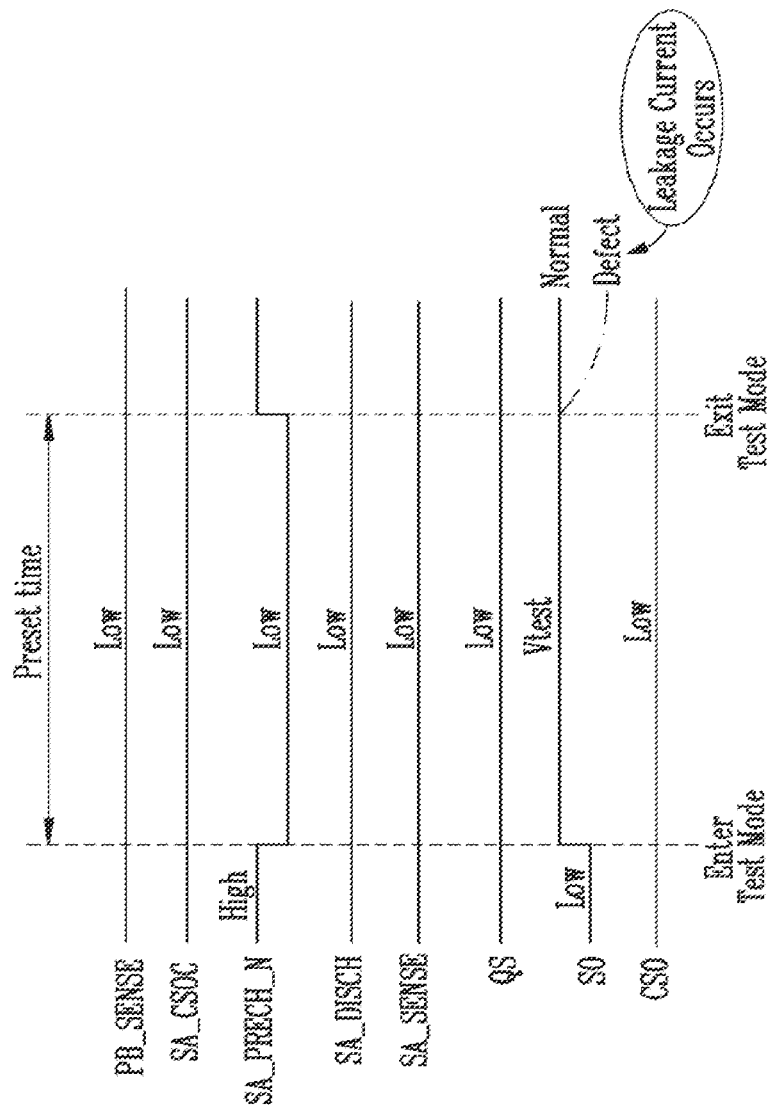

PAGE BUFFER, MEMORY DEVICE INCLUDING THE PAGE BUFFER AND OPERATING METHOD THEREOF

CROSS-REFERENCE TO RELATED APPLICATION

The present application claims priority under 35 U.S.C. § 119(a) to Korean patent application number 10-2020-0134650, filed on Oct. 16, 2020, in the Korean Intellectual Property Office, the entire disclosure of which is incorporated herein by reference.

BACKGROUND

1. Technical Field

The present disclosure generally relates to an electronic device, and more particularly, to a memory device and an operating method of the memory device.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there may be provided a memory device including: a page buffer connected to a memory cell through a bit line, the page buffer configured to sense a threshold voltage of the memory cell through a potential of a sensing node electrically connected to the bit line; a voltage generator configured to generate a test voltage to be applied to the sensing node; and a test controller configured to control the voltage generator to apply the test voltage to the sensing node, and detect a defect of the page buffer, based on a leakage current value of the sensing node.

In accordance with another aspect of the present disclosure, there may be provided a method for operating a memory device including a page buffer connected to a memory cell through a bit line, the method including: generating a test voltage; applying the test voltage to a sensing node electrically connected to the bit line to sense a threshold voltage of the memory cell in the page buffer; and detecting a defect of the page buffer, based on a leakage current value of the sensing node.

In accordance with still another aspect of the present disclosure, there may be provided a page buffer including: a first switch connected between a bit line and a common sensing node; a second switch and a third switch, connected in series between a power node and a sensing node; a fourth switch connected between the common sensing node and the sensing node; and a fifth switch and a sixth switch, connected in series between a ground voltage node and the sensing node, wherein the page buffer applies a test voltage to the sensing node through the power node by turning off the first and sixth switches and turning on the second and third switches, and applies the test voltage to the common sensing node according to whether the fourth switch turns on.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 5A is a timing diagram illustrating an operation of the page buffer in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments may provide a memory device having improved page buffer test performance and an operating method of the storage device.

Figure 1:
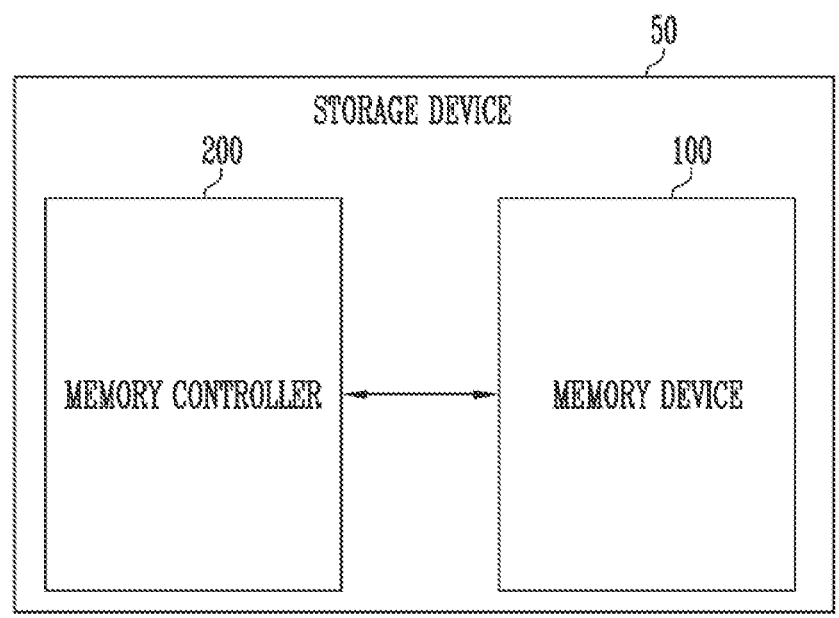
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme to improve operational performance. The interleaving scheme may be an operating scheme that allows operation periods of at least two memory devices 100 to overlap with each other.

The host may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
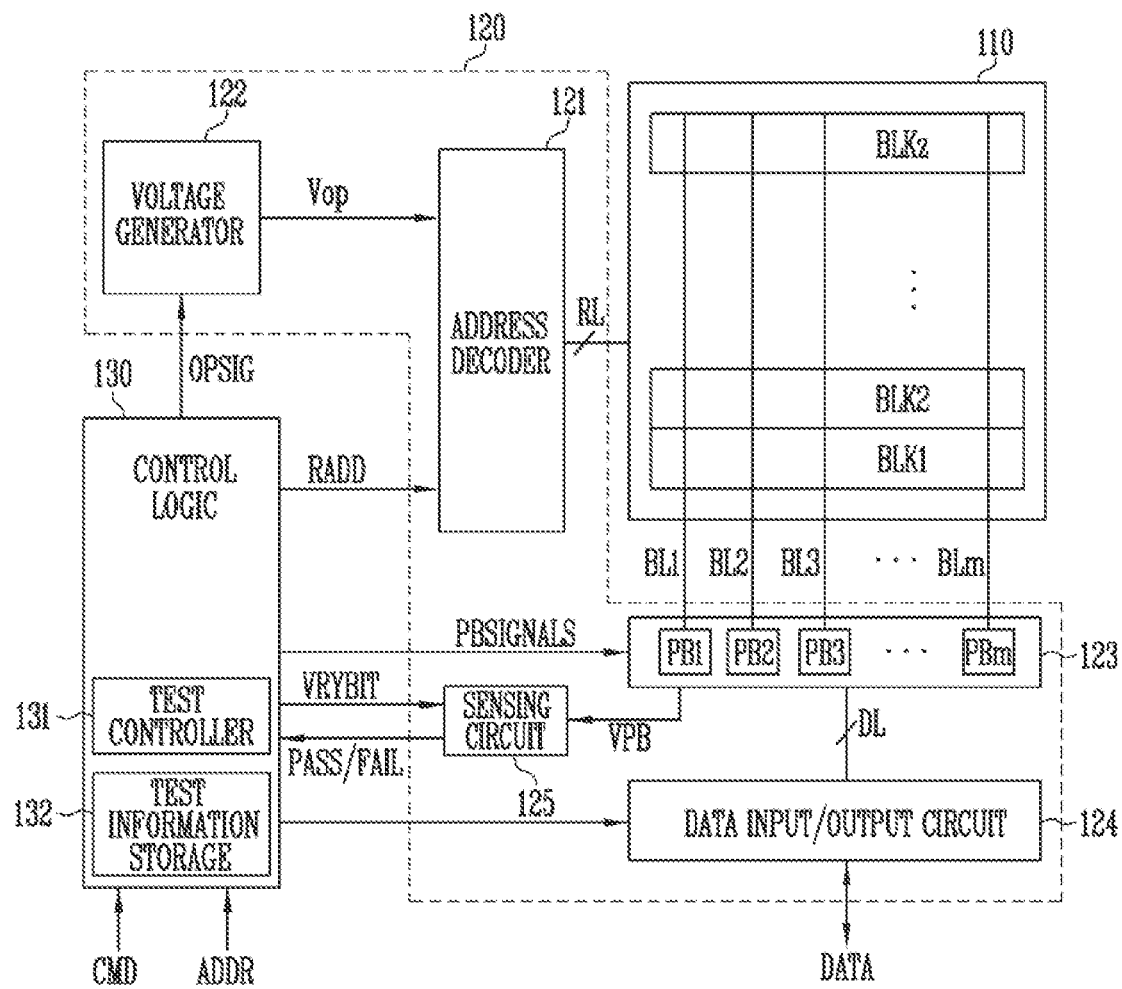
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be connected in series between a drain select transistor and memory cells and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a memory block selected according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least one memory block according to the decoded block address. In the erase operation, the address decoder 121 may apply a ground voltage to word lines connected to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are connected to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is connected to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the control logic 130 may include a test controller 131 and a test information storage 132.

The test controller 131 may detect a defect of the page buffer included in the read/write circuit 123. The test controller 131 may control the voltage generator 122 to generate a test voltage to be applied to a sensing node of the page buffer. In an embodiment, the voltage generator 122 may generate a power voltage, based on an external voltage. The voltage generator 122 may generate a test voltage, based on the external voltage or the power voltage.

The test controller 131 may determine a leakage current value of the sensing node, based on a variation in potential of the sensing node after the test voltage is applied to the sensing node. The test controller 131 may detect a defect of the page buffer, based on a result obtained by comparing the leakage current value with a reference value. For example, when the leakage current value exceeds the reference value, the test controller 131 may determine that the defect exists in the page buffer.

In an embodiment, an operation in which the test controller 131 detects a defect of the page buffer by applying the test voltage to the sensing node may be performed in a wafer test process. However, a time at which the operation of detecting the defect of the page buffer is performed is not limited to this embodiment.

When the defect of the page buffer is detected, the test information storage 132 may store information on a memory block including a memory cell connected to the page buffer. The corresponding memory block may be set as a bad block.

Figure 3:
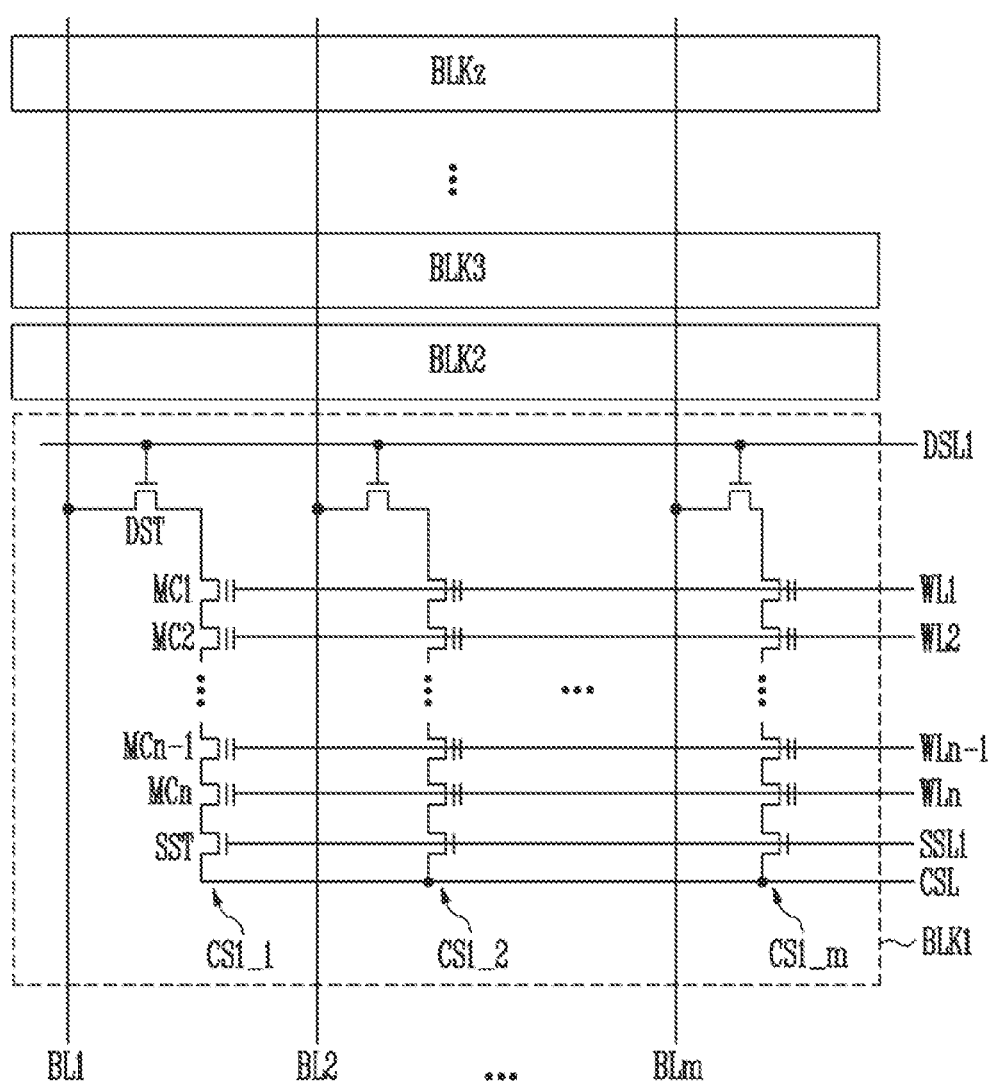
FIG. 3 is a diagram illustrating a memory cell array shown in FIG. 2.

FIG. 3 is a diagram illustrating the memory cell array shown in FIG. 2.

Referring to FIG. 3, first to zth memory blocks BLK1 to BLKz are commonly connected to the first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_m (m is a positive integer). First to mth cell strings CS1_1 to CS1_m are respectively connected to the first to mth bit lines BL1 to BLm. Each of the first to mth cell strings CS1_1 to CS1_m includes a drain select transistor DST, a plurality of memory cells MC1 to MCn (n is a positive integer) connected in series, and a source select transistor SST.

A gate terminal of the drain select transistor DST included in each of the first to mth cell strings CS1_1 to CS1_m is connected to a drain select line DSL1. Gate terminals of first to nth memory cells MC1 to MCn included in each of the first to mth cell strings CS1_1 to CS1_m are respectively connected to first to nth word lines WL1 to WLn. A gate terminal of the source select transistor SST included in each of the first to mth cell strings CS1_1 to CS1_m is connected to a source select line SSL1.

For convenience of description, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is connected to the first bit line BL1. A source electrode of the drain select transistor DST included in the first cell string CS1_1 is connected to a drain terminal of the first memory cell MC1 included in the first cell string CS1_1. The first to nth memory cells MC1 to MCn are connected in series to each other. A drain terminal of the source select transistor SST included in the first cell string CS1_1 is connected to a source terminal of the nth memory cell MCn included in the first cell string CS1_1. A source terminal of the source select transistor SST included in the first cell string CS1_1 is connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 is controlled by the address decoder 121 shown in FIG. 2. The common source line CSL may be controlled by the control logic 130 shown in FIG. 2. The first to mth bit lines BL1 to BLm are controlled by the read/write circuit 123 shown in FIG. 2.

Figure 4:
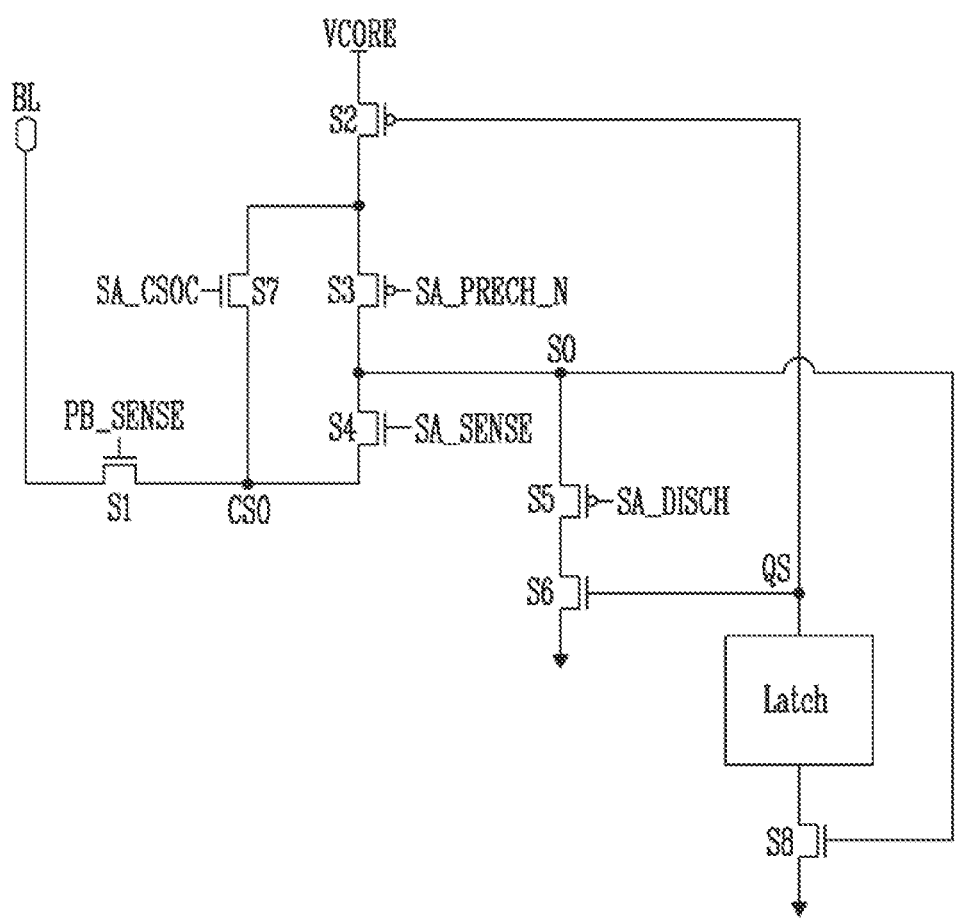
FIG. 4 is a diagram illustrating a page buffer shown in FIG. 2 in accordance with an embodiment of the present disclosure.

FIG. 4 is a diagram illustrating a page buffer shown in FIG. 2 in accordance with an embodiment of the present disclosure.

Referring to FIG. 4, the page buffer may be connected to a memory cell through a bit line BL. The page buffer may include first to sixth switches S1 to S6 and a latch. The page buffer may additionally include seventh and eighth switches S7 and S8.

In FIG. 4, the first switch S1 may be connected between the bit line BL and a common sensing node CSO, and be controlled according to a page buffer signal PB_SENSE.

The second switch S2 and the third switch S3 may be connected in series between a power node and a sensing node SO. The second switch S2 may be controlled according to a data signal QS stored in the latch. The third switch S3 may be controlled according to a precharge signal SA_PRECH_N.

The fourth switch S4 may be connected between the common sensing node CSO and the sensing node SO, and be controlled according to a sensing transfer signal SA_SENSE.

The fifth switch S5 and the sixth switch S6 may be connected in series between a ground voltage node and the sensing node SO. The fifth switch S5 may be controlled according to a discharge signal SA_DISCH. The sixth switch S6 may be controlled according to the data signal QS stored in the latch.

The seventh switch S7 may be connected between the common sensing node CSO and a connection portion of the second switch S2 and the third switch S3. The seventh switch S7 may be controlled according to a precharge transmission signal SA_CSOC.

The eighth switch S8 may be connected between the latch and the ground voltage node, and be controlled according to a potential value of the sensing node SO.

In an embodiment, a power voltage VCORE generated based on an external voltage may be applied to the power node. In another embodiment, the external voltage may be applied to the power node. A voltage applied to the power node is not limited to this embodiment.

In FIG. 4, the page buffer may apply a test voltage to the sensing node SO through the power node for a predetermined time. For example, the page buffer may turn off the first, fourth, fifth, and sixth switches S1, S4, S5, and S6 and turn on the second and third switches S2 and S3 for the predetermined time. The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In another embodiment, the page buffer may apply the test voltage to the sensing node SO and the common sensing node CSO through the power node for the predetermined time. For example, the page buffer may turn off the first, fifth, and sixth switches S1, S5, and S6 and turn on the second, third, and fourth switches S2, S3, and S4 for the predetermined time.

The page buffer may apply the page buffer signal PB_SENSE of a low level to the first switch S1 for the predetermined time. The page buffer may apply the precharge signal SA_PRECH_N of the low level to the third switch S3. The page buffer may apply the sensing transfer signal SA_SENSE of the low level to the fourth switch S4. The page buffer may apply the discharge signal SA_DISCH of the low level or the high level to the fifth switch S5. The page buffer may apply the data signal QS of the low level to the second switch S2 and the sixth switch S6. The test voltage may be applied to only the sensing node SO. The data signal QS stored in the latch before the test voltage is applied to the sensing node SO may be set to the low level.

In an embodiment, the page buffer may apply the page buffer signal PB_SENSE of the low level to the first switch S1 for the predetermined time. The page buffer may apply the precharge signal SA_PRECH_N of the low level to the third switch S3. The page buffer may apply the sensing transfer signal SA_SENSE of the high level to the fourth switch S4. The page buffer may apply the discharge signal SA_DISCH of the low level or the high level to the fifth switch S5. The page buffer may apply the data signal QS of the low level to the second switch S2 and the sixth switch S6. In an embodiment, the data signal QS stored in the latch before the test voltage is applied to the sensing node SO may be set to the low level. The test voltage may be applied to the sensing node SO and the common sensing node CSO. The data signal QS stored in the latch before the test voltage is applied to the sensing node SO and the common sensing node CSO may be set to the low level.

In an embodiment, the first and fourth to eighth switches S1 and S4 to S8 may include an NMOS transistor. The second and third switches S2 and S3 may include a PMOS (i.e., positive metal-oxide semiconductor) transistor. However, a transistor included in each switch is not limited to this embodiment. The NMOS (i.e., negative metal-oxide semiconductor) transistor may be replaced with the PMOS transistor. On the contrary, the PMOS transistor may be replaced with the NMOS transistor.

FIG. 5A is a timing diagram illustrating an operation of the page buffer in accordance with an embodiment of the present disclosure.

Referring to FIG. 5A, the page buffer may enter into a test mode according to a request from the outside of the memory device. The page buffer may enter into the test mode in a wafer test process. The page buffer may exit from the test mode after a predetermined time after the page buffer enters into the test mode.

Referring to FIGS. 4 and 5A, from before the page buffer enters into the test mode, the page buffer signal PB_SENSE may be set to the low level. The precharge transmission signal SA_CSOC may be set to the low level. The discharge signal SA_DISCH may be set to the low level. The sensing transmission signal SA_SENSE may be set to the low level. The data signal QS stored in the latch may be set to the low level. At the time when the page buffer enters into the test mode, the precharge signal SA_PRECH_N may be set to the low level.

A test voltage Vtest transferred through the power node may be applied to the sensing node SO during the predetermined time. The test voltage Vtest may be an external voltage or a power voltage generated based on the external voltage.

A leakage current value may be determined according to a variation in potential of the sensing node SO after the page buffer exits from the test mode. A defect of the page buffer may be detected based on a result obtained by the leakage current value with a reference value.

For example, when the potential of the sensing node SO is decreased by a constant width or more, it may be determined that a bridge exits between the sensing node SO and the ground voltage node. That is, a leakage current of the sensing node SO occurs due to the bridge, and a data value of the sensing node SO is unreliable when the value of the leakage current exceeds the reference value. Therefore, it may be determined that the corresponding page buffer has a defect.

Figure 5B:
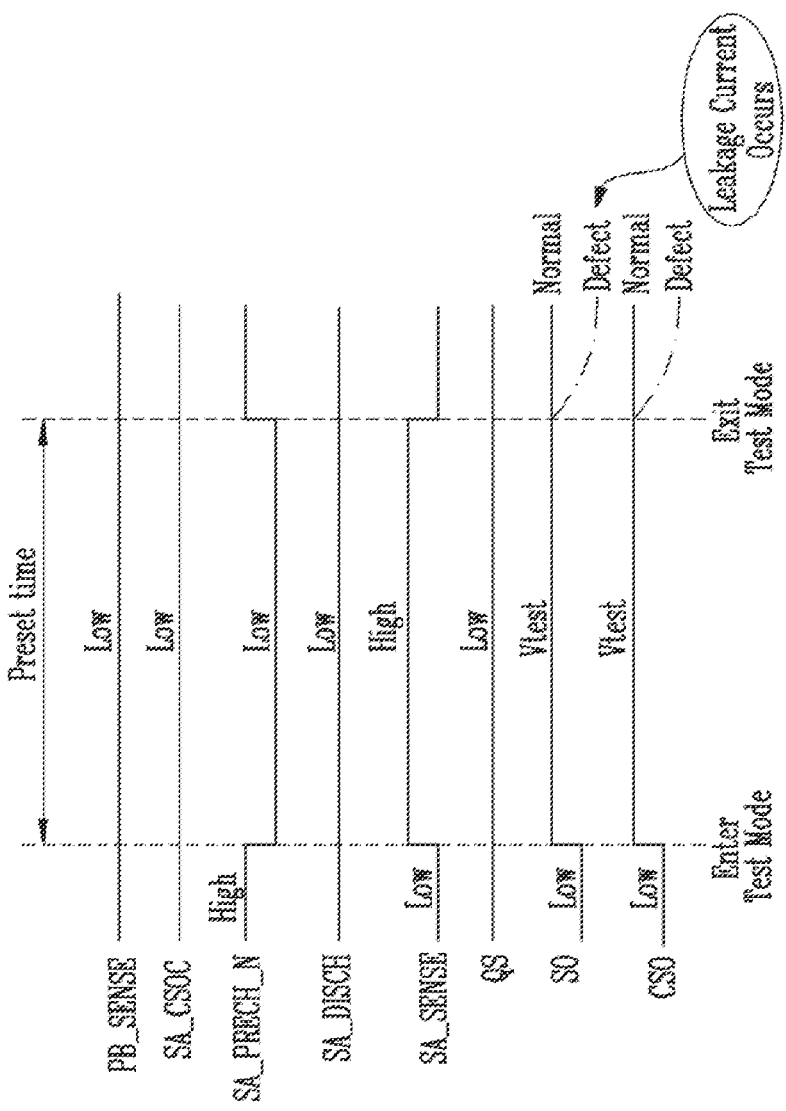
FIG. 5B is a timing diagram illustrating an operation of the page buffer in accordance with an embodiment of the present disclosure.

FIG. 5B is a timing diagram illustrating an operation of the page buffer in accordance with an embodiment of the present disclosure.

Referring to FIG. 5B, as compared with FIG. 5A, the sensing transmission signal SA_SENSE at the time when the page buffer enters into the test mode may be set to the high level. Other signals may be set like those shown in FIG. 5A.

A test voltage Vtest transferred through the power node may be applied to the sensing node SO and the common sensing node CSO during the predetermined time. The test voltage Vtest may be an external voltage or a power voltage generated based on the external voltage.

A leakage current value may be determined according to a variation in potential of the sensing node SO and a variation in potential of the common sensing node CSO after the page buffer exits from the test mode. A defect of the page buffer may be detected based on a result obtained by the leakage current value with a reference value. The defect of the page buffer may be determined as described in FIG. 5A.

Figure 6:
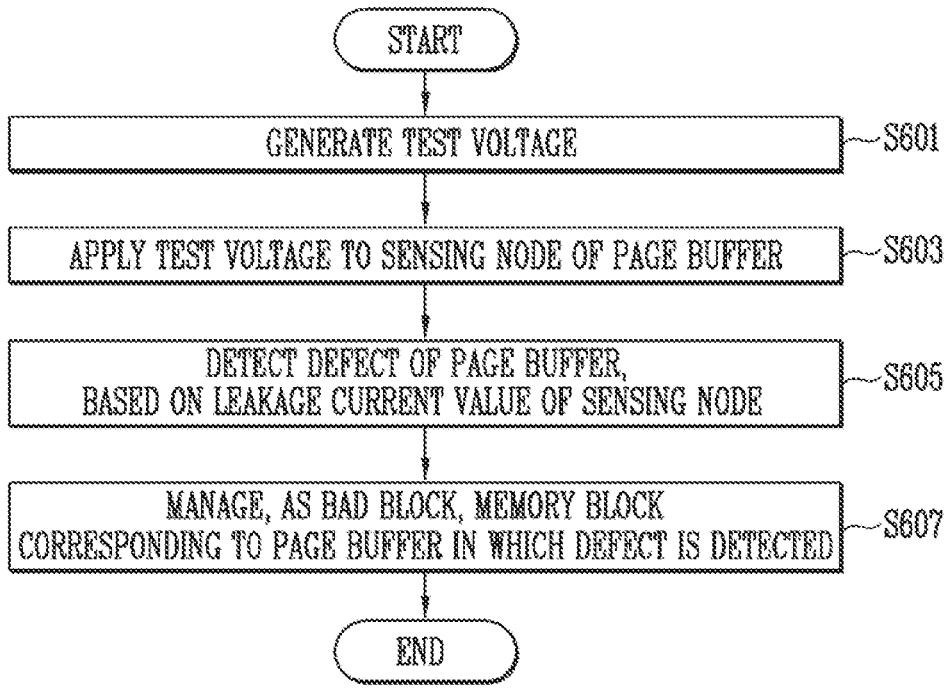
FIG. 6 is a flowchart illustrating an operation of the memory device in accordance with an embodiment of the present disclosure.

FIG. 6 is a flowchart illustrating an operation of the memory device in accordance with an embodiment of the present disclosure.

Referring to FIG. 6, in step S601, the memory device may generate a test voltage. The memory device may generate a power voltage, based on an external voltage input from the outside of the memory device. The memory device may generate the test voltage, based on the external voltage or the power voltage.

In step S603, the memory device may apply the test voltage to the sensing node of a page buffer. The memory device may apply the test voltage to the sensing node of the page buffer in a wafer test process. However, a time at which a test operation is performed is not limited thereto. The memory device may autonomously perform the test operation therein. In various embodiments, the test voltage may be applied to the sensing node and the common sensing node.

In step S605, the memory device may detect a defect of the page buffer, based on a leakage current value of the sensing node.

In step S607, the memory device may manage, as a bad block, a memory block corresponding to the page buffer in which the defect is detected. The memory block corresponding to the page buffer may be a memory block including a memory cell connected to the page buffer.

Figure 7:
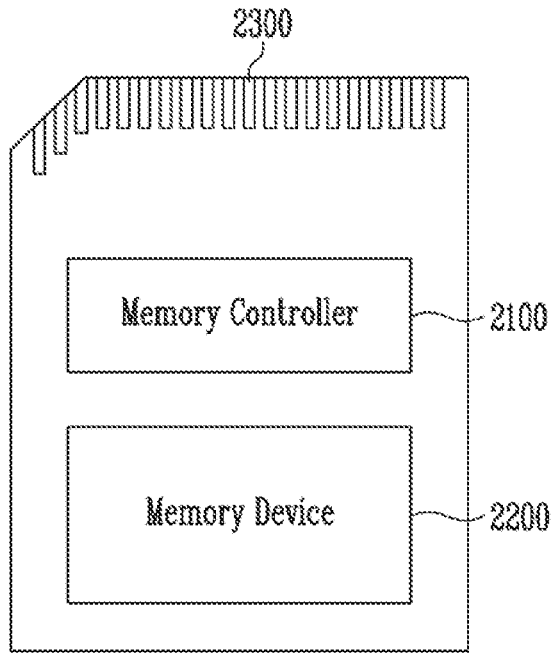
FIG. 7 is a block diagram illustrating a memory card system to which the storage device is applied in accordance with an embodiment of the present disclosure.

FIG. 7 is a block diagram illustrating a memory card system to which the storage device is applied in accordance with an embodiment of the present disclosure.

Referring to FIG. 7, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

For example, the memory controller 2100 may include components such as a Random Access Memory (RAM), a processing unit, a host interface, a memory interface, and the error corrector.

The memory controller 2100 may communicate with an external device through the connector 2300. The memory controller 2100 may communicate with the external device (e.g., the host) according to a specific communication protocol. For example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

For example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 8:
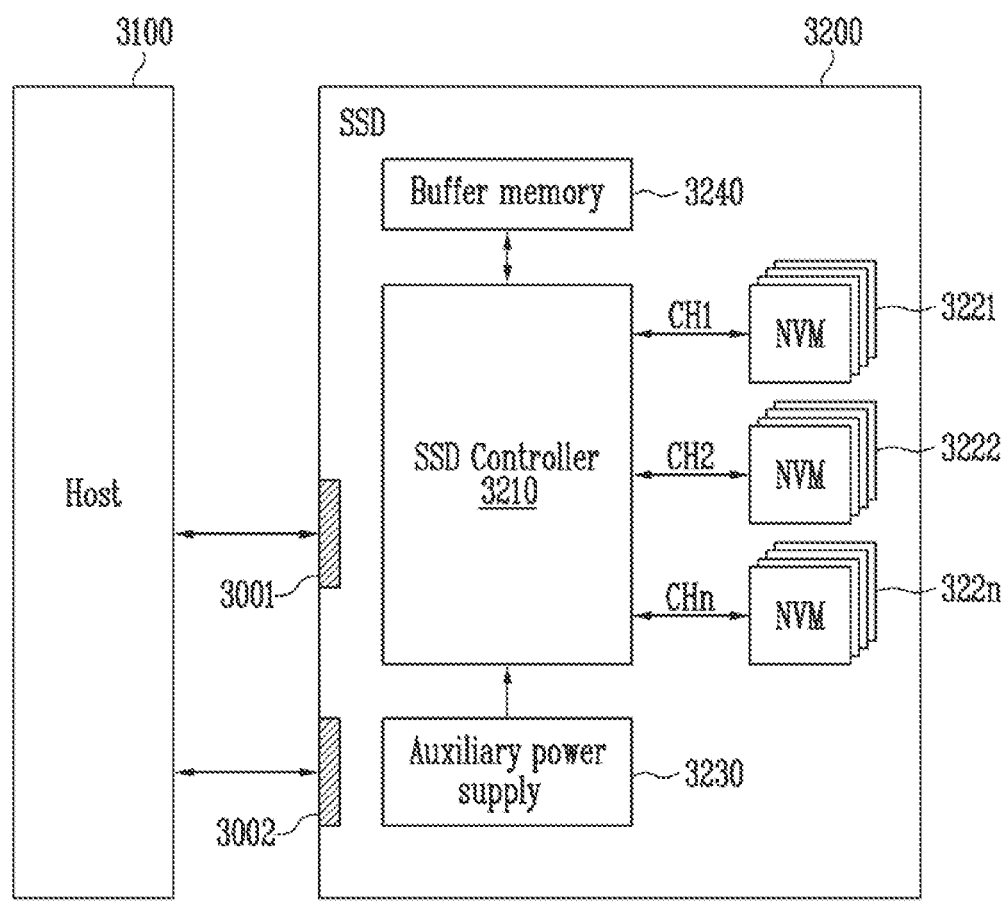
FIG. 8 is a block diagram illustrating a Solid State Drive (SSD) to which the storage device is applied in accordance with an embodiment of the FIG. 9 is a block diagram illustrating a user system to which the storage device is applied in accordance with an embodiment of the present disclosure.

FIG. 8 is a block diagram illustrating a Solid State Drive (SSD) to which the storage device is applied in accordance with an embodiment of the Referring to FIG. 8, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In accordance with an embodiment of the present disclosure, the SSD controller 3210 may serve as the memory controller 200 described with reference to FIG. 1.

The SSD controller 3210 may control the plurality of flash memories 3221 to 322n in response to a signal SIG received from the host 3100. For example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. For example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 9:
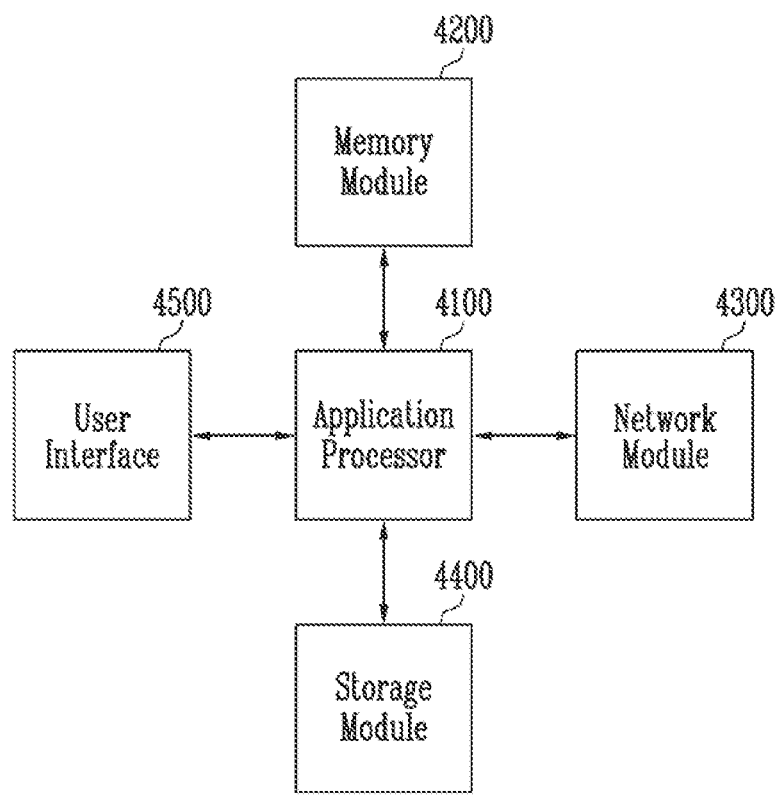

FIG. 9 is a block diagram illustrating a user system to which the storage device is applied in accordance with an embodiment of the present disclosure.

Referring to FIG. 9, the user system 4000 includes an application processor 4100, a memory module 4200, a network module 4300, a storage module 4400, and a user interface 4500.

The application processor 4100 may drive components included in the user system 4000, an operating system (OS), a user program, or the like. For example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. For example, the application processor 4100 and the memory module 4200 may be provided as one semiconductor package by being packaged based on a Package on Package (PoP).

The network module 4300 may communicate with external devices. For example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. For example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. For example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a memory device having improved page buffer test performance and an operating method of the storage device.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:
1. A memory device comprising:
   a page buffer connected to a memory cell through a bit line, the page buffer configured to sense a threshold voltage of the memory cell through a potential of a sensing node electrically connected to the bit line;
   a voltage generator configured to generate a test voltage to be applied to the sensing node; and
   a test controller configured to apply the test voltage to the sensing node, disconnect a connection between the sensing node and the bit line while the test voltage is applied to the sensing node, and detect a defect of the page buffer, based on a leakage current value of the sensing node, wherein the test controller maintains a disconnection between the sensing node and the bit line after an application of the test voltage to the sensing node is finished.

2. The memory device of claim 1,
wherein the test controller determines the leakage current value of the sensing node, based on a variation in potential of the sensing node after the test voltage is applied to the sensing node.

3. The memory device of claim 2,
wherein the test controller detects the defect of the page buffer, based on a result obtained by comparing the leakage current value of the sensing node with a reference value.

4. The memory device of claim 1, further comprising a test information storage configured to store information on a memory block including the memory cell connected to the page buffer, when the defect of the page buffer is detected.

5. The memory device of claim 1,
wherein the voltage generator generates a power voltage, based on an external voltage, and generates the test voltage, based on at least one of the external voltage and the power voltage.

6. A method for operating a memory device including a page buffer connected to a memory cell through a bit line, the method comprising:
generating a test voltage;
applying the test voltage to a sensing node electrically connected to the bit line to sense a threshold voltage of the memory cell in the page buffer;
disconnecting a connection between the sensing node and the bit line while the test voltage is applied to the sensing node;
maintaining a disconnection between the sensing node and the bit line after an application of the test voltage to the sensing node is finished; and
detecting a defect of the page buffer, based on a leakage current value of the sensing node.

7. The method of claim 6,
wherein the detecting of the defect of the page buffer includes:
determining the leakage current value of the sensing node, based on a variation in potential of the sensing node after the test voltage is applied to the sensing node; and
detecting the defect of the page buffer, based on a result obtained by comparing the leakage current value of the sensing node with a reference value.

8. The method of claim 6,
wherein the generating of the test voltage includes:
generating a power voltage, based on an external voltage; and
generating the test voltage, based on at least one of the external voltage and the power voltage.

9. The method of claim 6, further comprising storing information on a memory block including the memory cell connected to the page buffer, when the defect of the page buffer is detected.

10. A page buffer comprising:
a first switch connected between a bit line and a common sensing node;
a second switch and a third switch, connected in series between a power node and a sensing node;
a fourth switch connected between the common sensing node and the sensing node; and
a fifth switch and a sixth switch, connected in series between a ground voltage node and the sensing node,
wherein the page buffer applies a test voltage to the sensing node through the power node by turning off the first and sixth switches and turning on the second and third switches, and applies the test voltage to the common sensing node according to whether the fourth switch turns on.

11. The page buffer of claim 10,
wherein the page buffer applies, as the test voltage, at least one of an external voltage and a power voltage generated based on the external voltage to the sensing node through the power node.

12. The page buffer of claim 10,
wherein the page buffer:
controls the first switch through a page buffer signal;
controls the third switch through a precharge signal;
controls the fourth switch through a sensing transfer signal;
controls the fifth switch through a discharge signal; and
controls the second switch and the sixth switch through a data signal stored in a latch.

13. The page buffer of claim 12,
wherein the page buffer:
applies the test voltage to the sensing node for a predetermined time; and
applies the precharge signal of a low level to the third switch, applies the sensing transfer signal of the low level to the fourth switch, and applies the data signal of the low level to the second switch and the sixth switch, for the predetermined time.

14. The page buffer of claim 12,
wherein the page buffer:
applies the test voltage to the sensing node and the common sensing node for a predetermined time; and
applies the precharge signal of a low level to the third switch, applies the sensing transfer signal of a high level to the fourth switch, and applies the data signal of the low level to the second switch and the sixth switch, for the predetermined time.

15. The page buffer of claim 10,
wherein the first switch and the fourth to sixth switches include an NMOS transistor, and the second and third switches include a PMOS transistor.

* * * * *